(12) United States Patent
El Dirani et al.

(10) Patent No.: US 10,804,275 B2
(45) Date of Patent: Oct. 13, 2020

(54) MEMORY ARRAY COMPRISING MEMORY CELLS OF Z2-FET TYPE

(71) Applicant: STMicroelectronics SA, Montrouge (FR)

(72) Inventors: Hassan El Dirani, Grenoble (FR); Thomas Bedecarrats, Saint Martin d'Heres (FR); Philippe Galy, Le Touvet (FR)

(73) Assignee: STMicroelectronics SA, Montrouge (FR)

( * ) Notice: Subject to any disclaimer, the term of this patent is extended or adjusted under 35 U.S.C. 154(b) by 151 days.

(21) Appl. No.: 16/199,810

(22) Filed: Nov. 26, 2018

(65) Prior Publication Data

US 2019/0164973 A1 May 30, 2019

(30) Foreign Application Priority Data

Nov. 28, 2017 (FR) ...................................... 17 61279

(51) Int. Cl.
| | | |
|---|---|---|
| *H01L 27/108* | (2006.01) | |
| *G11C 11/39* | (2006.01) | |
| *H01L 27/102* | (2006.01) | |
| *H01L 29/74* | (2006.01) | |
| *G11C 11/402* | (2006.01) | |
| *G11C 11/409* | (2006.01) | |

(52) U.S. Cl.
CPC ........ *H01L 27/10802* (2013.01); *G11C 11/39* (2013.01); *G11C 11/409* (2013.01); *G11C 11/4023* (2013.01); *H01L 27/1027* (2013.01); *H01L 27/10844* (2013.01); *H01L 27/10897* (2013.01); *H01L 29/74* (2013.01)

(58) Field of Classification Search
IPC .................. H01L 27/10802,29/7391, 27/1027, 27/10844, 27/10897, 29/74; G11C 11/39, 11/4023, 11/409
See application file for complete search history.

(56) References Cited

U.S. PATENT DOCUMENTS

| | | | | |
|---|---|---|---|---|
| 8,581,310 | B2 * | 11/2013 | Wan ...................... | H01L 29/808 257/255 |
| 8,634,229 | B2 * | 1/2014 | Wan .................. | H01L 27/10802 365/149 |
| 9,905,565 | B1 | 2/2018 | El Dirani et al. | |

(Continued)

FOREIGN PATENT DOCUMENTS

JP          2007066364 A       3/2007

OTHER PUBLICATIONS

INPI Search Report and Written Opinion for FF 1761279 dated Jul. 23, 2018 (9 pages).

(Continued)

*Primary Examiner* — Hrayr A Sayadian
(74) *Attorney, Agent, or Firm* — Crowe & Dunlevy (57) ABSTRACT

A memory array includes memory cells of $Z^2$-FET type arranged in rows and columns, wherein each memory cell includes a MOS-type selection transistor and a first region of a first conductivity type that is shared in common with a drain region of the first conductivity type of the selection transistors. The selection transistors of a same column of the memory array have a common drain region, a common source region, and a common channel region.

23 Claims, 5 Drawing Sheets

(56) References Cited

U.S. PATENT DOCUMENTS

2013/0069122 A1* 3/2013 Wan .................... H01L 29/7391
 257/256
2013/0100729 A1* 4/2013 Wan .................... H01L 27/1203
 365/149

OTHER PUBLICATIONS

Jing Wan et al: "A systematic study of the sharp-switching Z2-FET device: from mechanism to modeling and compact memory applications", XP055493547 vol. 90, Apr. 29, 2013 pp. 2-11.
Wan et al. "Progress in Z2-FET 1T-DRAM: Retention time, writing modes, selective array operation, and dual bit storage", Solid-State Electronics, vol. 84, pp. 147-154, 2013.
Nemati F et al: Fully planar 0.562/splmu/m<2> T-RAM cell in a 130 nm SOI CMOS logic technology for high-Density high performance SRAMs—Electron Devices Meeting 2004. IEDM Technical Digest. IEEE International Sans Francisco, CA, USA. Dec. 13-15, 2004. Piscataway, NJ USA, IEEE Dec. 13, 2004. pages 273-276, XP010788759.

\* cited by examiner

MEMORY ARRAY COMPRISING MEMORY CELLS OF Z2-FET TYPE

PRIORITY CLAIM

This application claims the priority benefit of French Application for Patent No. 1761279, filed on Nov. 28, 2017, the content of which is hereby incorporated by reference in its entirety to the maximum extent allowable by law.

TECHNICAL FIELD

The present disclosure relates to a memory array comprising memory cells of $Z^2$-FET type.

BACKGROUND

Figure 1:
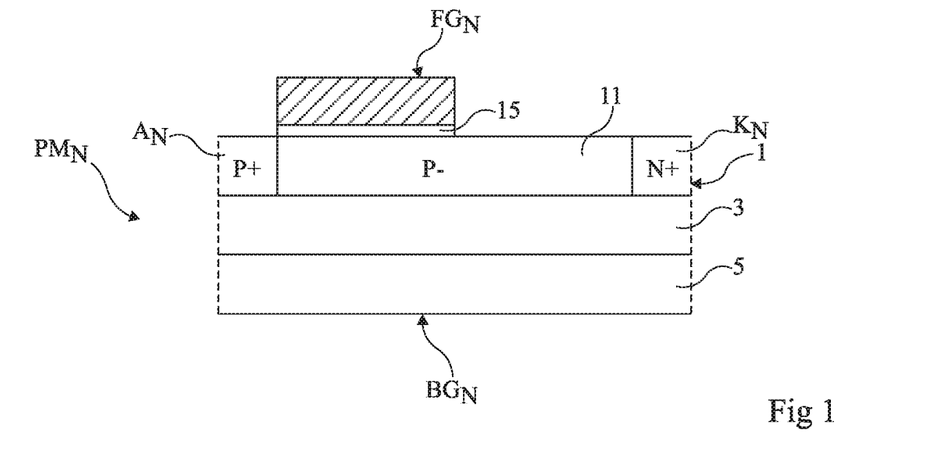
FIG. 1, previously described, is a cross-section view of an N-type memory cell of $Z^2$-FET type.

FIG. 1 is a cross-section view schematically showing a memory cell of $Z^2$-FET type, and more particularly an N-type $Z^2$-FET memory cell $PM_N$. Such a memory cell $PM_N$ is, for example, described in an article by Jing Wan, et al., "Progress in $Z^2$-FET 1T-DRAM: Retention time, writing modes, selective array operation, and dual bit storage", Solid-State Electronics, volume 84, pages 147 to 154, 2013 (incorporated by reference).

Memory cell $PM_N$ is formed inside and on top of a SOI ("Silicon On Insulator") structure comprising a semiconductor layer 1, for example made of silicon, resting on an insulating layer 3, referred to as BOX (for "Buried OXide") which itself rests on a semiconductor support 5, for example made of silicon. Semiconductor support 5 may be used as a back gate $BG_N$ of memory cell $PM_N$. An active area is delimited in layer 1 and comprises an anode region $A_N$ and a cathode region $K_N$ (or an anode $A_N$ and a cathode $K_N$) separated by an intermediate region 11. Anode region $A_N$ is heavily P-type doped (P+) and is located on the left-hand side of FIG. 1. Cathode region $K_N$ is heavily N-type doped (N+) and is located on the right-hand side of FIG. 1. Intermediate region 11 is lightly P-type doped (P−) and is located between anode region $A_N$ and cathode region $K_N$. An insulated gate is formed on a portion of layer 11 on the side of anode region 7. The insulated gate comprises a gate layer $FG_N$ called front gate $FG_N$ made of polysilicon and an insulating layer 15 resting on the portion of layer 11.

Whatever the operating mode of an N-type $Z^2$-FET memory cell $PM_N$, a negative bias voltage is applied to back gate $BG_N$ and a reference voltage, for example the ground, is applied to cathode $K_N$. When the memory cell is in a waiting state, a low-state voltage is applied to anode $A_N$, and a high-state voltage is applied to front gate $FG_N$. To read or write a "1" or a "0" from or into the memory cell, control voltages are applied to anode $A_N$ and to front gate $FG_N$ in the form of pulses. To write a "1" into the memory cell, a rising edge is applied to anode $A_N$ and a falling edge is applied to front gate $FG_N$, which results in attracting electrons under front gate $FG_N$ of the memory cell. The memory cell then is in a low-impedance state. To write a "0", the electrons are drained off from front gate $FG_N$ by the application of a falling edge to front gate $FG_N$ and of a voltage in the low state to anode $A_N$. The memory cell then is in a high impedance state. To read from the memory cell, its impedance is determined by holding the voltage of front gate $FG_N$ at a high voltage and by applying a rising edge to anode $A_N$. The values of the control voltages and the operation of the memory cell are described in further detail in the above-mentioned Wan article. The Wan article also specifies that $Z^2$-FET memory cells are, for example, used in dynamic random-access memories.

Figure 2:
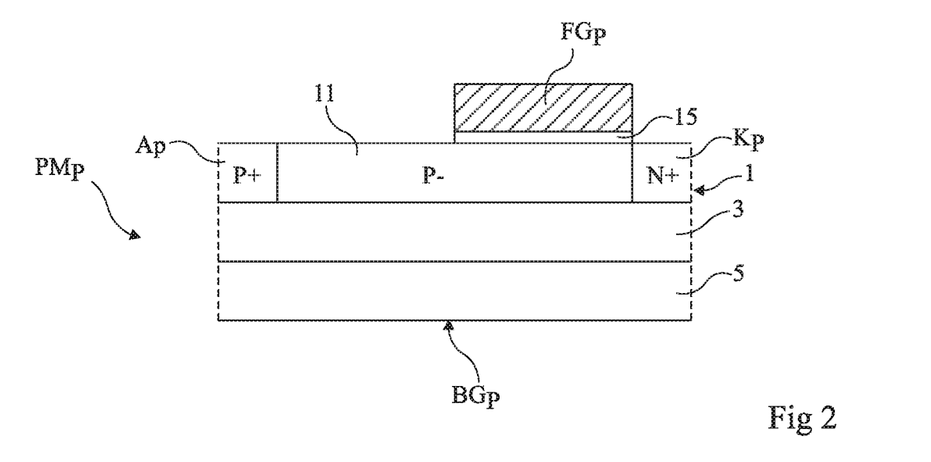
FIG. 2, previously described, is a cross-section view of a P-type memory cell of $Z^2$-FET type.

FIG. 2 is a cross-section view of a P-type $Z^2$-FET memory cell $PM_P$. Memory cell $PM_P$ of FIG. 2 is identical to memory cell $PM_N$ of FIG. 1, and thus memory cell $PM_P$ comprises a semiconductor layer 1 resting on an insulating layer 3 which itself rests on a semiconductor layer 5. Layer 1 is divided into three regions: an anode region $A_P$, an intermediate region 11, and a cathode region $K_P$. The back gate and the front gate of memory cell PM are respectively designated with references $BG_P$ and $FG_P$. The difference between memory cell $PM_P$ and memory cell $PM_N$ is that the insulated gate of memory cell $PM_P$ is formed on a portion of layer 11 on the side of cathode region $K_P$. The insulated gate then always comprises front gate $FG_P$ and an insulating layer 15 resting on the portion of layer 11.

Whatever the operating mode of a P-type $Z^2$-FET memory cell $PM_P$, a positive bias voltage is applied to back gate 5, and a high voltage, for example called voltage Vdd, is applied to anode $A_P$. When the memory cell is in a state where it waits for a read or write operation, a voltage in the high state is applied to cathode $K_P$, and a low-state voltage is applied to front gate $FG_P$. To read or write a "1" or a "0" from or into the memory cell, control voltages are applied to cathode $K_P$ and to front gate $FG_P$ in the form of pulses. To write a "1" into the memory cell, a falling edge is applied to cathode $K_P$ and a rising edge is applied to front gate $FG_P$, which results in attracting holes under front gate $FG_P$ of the memory cell. The memory cell then is in a low-impedance state. To write a "0" into the memory cell, holes are drained off from under front gate $FG_P$ of the memory cell by the application of a rising edge to front gate $FG_P$ and of a high-state voltage to cathode $K_P$. The memory cell then is in a high impedance state. To read from the memory cell, its impedance is determined by holding the voltage of front gate $FG_P$ at a low voltage and by applying a falling edge to cathode $K_P$.

For certain applications, it would be desirable to be able to decrease the size of a dynamic random access memory (DRAM) comprising memory cells of $Z^2$-FET type.

SUMMARY

An embodiment provides a memory array comprising a plurality of memory cells of $Z^2$-FET type and of MOS-type selection transistors, wherein each memory cell comprises a first region of a first conductivity type common with a drain region of the first conductivity type of one of the selection transistors, wherein the selection transistors of a same column of the array have a common drain region, a common source region, and a common channel region.

According to an embodiment, the memory cells of a same column of the array have a common front gate.

According to an embodiment, the common front gate of the memory cells of a same column is connected to a word line.

According to an embodiment, each memory cell comprises a second region of a second conductivity type.

According to an embodiment, the second regions of the memory cells of a same row of the array are connected to a bit line.

According to an embodiment, the memory cells of a same row of the array are assembled two by two and have a second common region.

According to an embodiment, the first region of each memory cell is connected to a reference voltage.

According to an embodiment, the selection transistors of a same column have a common gate.

According to an embodiment, the common gate region of the selection transistors of a same column is connected to a control line.

According to an embodiment, the selection transistors are N-channel MOS transistors.

According to an embodiment, the selection transistors are P-channel MOS transistors.

According to an embodiment, the memory cells of $Z^2$-FET type comprise, on a substrate: an anode region; a cathode region; a P-type doped region separating the anode region from the cathode region; and an insulated gate region positioned on top and in contact with a portion of the lightly-doped region.

Another embodiment provides a method of manufacturing memory array, comprising: forming a plurality of memory cells of $Z^2$-FET type and a plurality of MOS-type selection transistors arranged in rows and in columns, wherein: the forming of each memory cell comprises forming a first region of a first conductivity type; the forming of each selection transistor comprises forming a drain region common with the first region of a memory cell and with all the selection transistors of a same column, the forming of a source region common to all the selection transistors of a same column, and the forming of a gate region common to all the selection transistors of a same column.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

The same elements have been designated with the same reference numerals in the different drawings. For clarity, only those steps and elements which are useful to the understanding of the described embodiments have been shown and are detailed. In particular, the general operation of a memory will not be reminded.

In the following description, when reference is made to terms qualifying the position and orientation such as "front", "back", "left-hand", "right-hand", "top", "upper", etc., reference is made to the orientation of the elements in the drawings. Unless otherwise specified, expressions "in the order of" and "substantially" mean to within 10%, preferably to within 5%.

In the following description, an N-type or P-type $Z^2$-FET memory cell is represented, in an electrical diagram, by a conventional diode symbol, having its anode corresponding to the anode of the memory cell and its cathode corresponding to the cathode of the memory cell. This symbol further comprises an additional connection, symbolizing the front gate, positioned on the lateral side of the diode symbol between the anode connection and the cathode connection. The symbol of the $Z^2$-FET memory cell is used in FIG. 4.

Figure 3A:
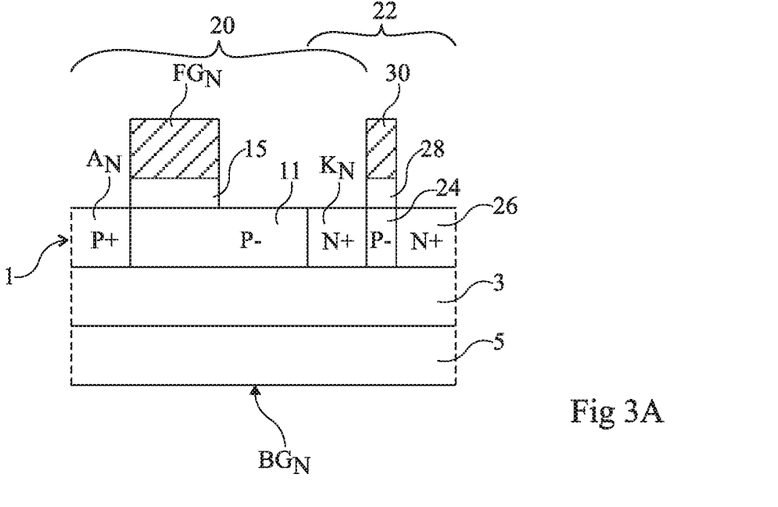
FIGS. 3A and 3B are a cross-section view and a top view of a memory cell along with its selection transistor.
Figure 3B:
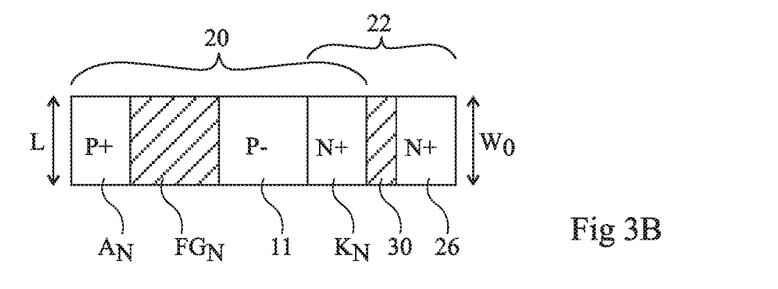

FIGS. 3A and 3B are a cross-section view and a top view of an N-type $Z^2$-FET memory cell 20 along with its selection transistor 22. Memory cell 20 is identical to the memory cell $PM_N$ described in relation with FIG. 1. Selection transistor 22 is an N-channel MOS transistor (NMOS).

Conventionally, selection transistor 22 comprises a drain region, a channel region 24, a source region 26, a gate insulator layer 28, and a conductive gate layer 30. Selection transistor 22 is formed on the same SOI structure (layers 1, 3, and 5) and in the same active area as memory cell 20. The drain region, channel region 24, and source region 26 are formed in semiconductor layer 1. The drain region is heavily N-type doped (N+) and is formed by cathode region $K_N$ of memory cell 20. Cathode region $K_N$ will then be indifferently called cathode region $K_N$, drain region $K_N$, or cathode and drain region $K_N$. Channel region 24 is lightly P-type doped (P−) and is formed in a region adjacent to drain region $K_N$. Source region 26 is heavily N-type doped (N+) and is formed in a region adjacent to channel region 24. Gate insulator region 28 rests on the upper surface of channel region 24. Gate layer or gate 30 rests on the upper surface of gate insulator layer 28. Conventionally, gate layer 30 may be made of polysilicon or of a conductive material, for example, a metal.

During operating phases of the memory cell, and more particularly when a "1" is written into a memory cell, the current in the selection transistor may be relatively high with respect to the gate width of the selection transistors.

As illustrated in FIG. 3B, the active area is rectangular, that is, gate width $W_O$ of transistor 22 is equal to width L of memory cell 20. A technology where width L of the memory cell is in the range from 80 nm to 1 µm, for example, in the order of 100 nm, is for example considered herein.

Figure 4:
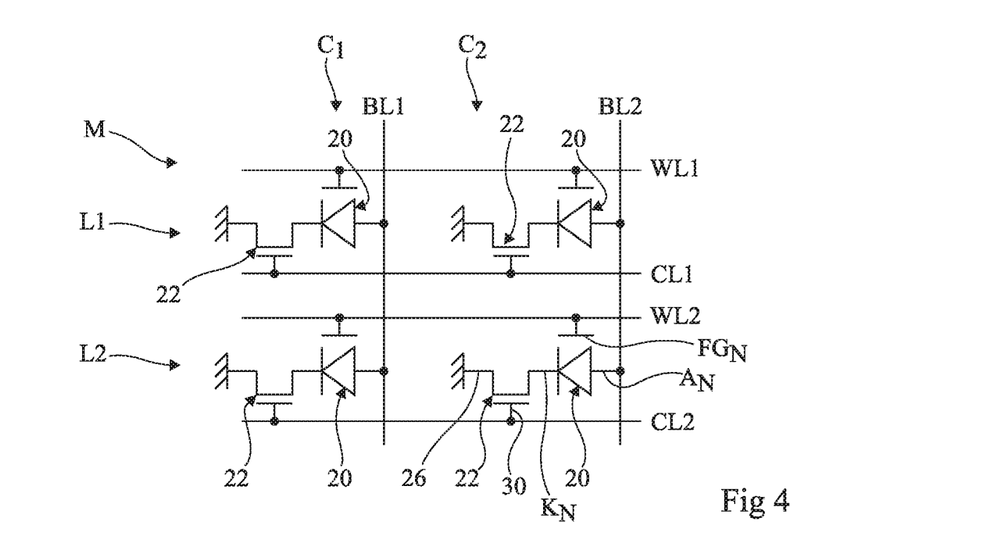
FIG. 4 is an electrical diagram of a memory array.

FIG. 4 is an electrical diagram of a portion of a memory array M comprising N-type $Z^2$-FET memory cells according to a solution which has already been provided. Each memory cell is controlled by an N-type selection MOS transistor, the selection transistor being for example arranged as described in relation with FIGS. 3A and 3B. A memory array M comprising 2×2 memory cells 20, each along with its selection transistor 22, has here been shown. Memory cells 20 are arranged in two columns C1, C2 and in two rows L1, L2.

The source of each selection transistor 22 is connected to a reference voltage, for example, the ground. The drain of each selection transistor is connected to the cathode of memory cell 20, as described in relation with FIGS. 3A and 3B.

In a same column C1, C2, each memory cell 20 has its anode $A_N$ connected to a same bit line BL1, BL2.

In a same row of memory cells, each memory cell has its front gate $FG_N$ connected to a word line WL1, WL2. Each selection transistor 22 has its gate 30 connected to a control line CL1, CL2.

Figure 5:
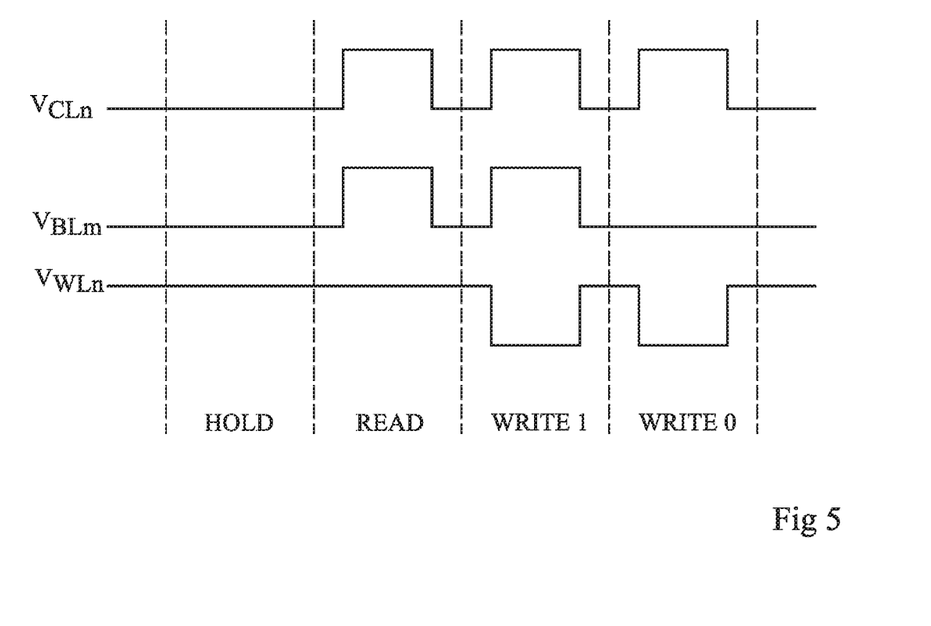
FIG. 5 is a timing diagram illustrating an embodiment of the memory array of FIG. 4.

FIG. 5 is a timing diagram illustrating an operating mode of a memory cell $20_{nm}$ of memory array M of FIG. 4, and belonging to a row Ln and to a column Cm. The timing diagram illustrates the time variation of voltages $V_{CLn}$, $V_{BLm}$ and $V_{WLn}$ during different operations performed on memory array M. Voltage $V_{CLn}$ is the voltage of control line CLn associated with row Ln. Voltage $V_{BLm}$ is the voltage of the bit line BLm associated with column Cm. Voltage $V_{WLn}$ is the voltage of the word line associated with row Ln.

When memory cell $20_{nm}$ is waiting for a read or write operation, it is in a state HOLD. Voltages $V_{CLn}$ and $V_{BLm}$ are in a low state and voltage $V_{WLn}$ is held in a high state.

During a read operation READ on memory cell $20_{nm}$, a high state is applied to voltages $V_{CLn}$ and $V_{BLm}$. Voltage $V_{WLn}$ remains in a high state. Once the read operation is over, memory cell $20_{nm}$ switches back to a state HOLD.

During an operation of writing a "1" WRITE1 into memory cell $20_{nm}$, a high state is applied to voltages $V_{CLn}$ and $V_{BLm}$. A low state is applied to voltage $V_{WLn}$. Once the write operation is over, memory cell $20_{nm}$ switches back to a state HOLD.

During an operation of writing a "0" WRITE0 into memory cell $20_{nm}$, a high state is applied to voltage $V_{CLn}$. Voltage $V_{BLm}$ remains in a low state. A low state is applied to voltage $V_{WLn}$. Once the write operation is over, memory cell $20_{nm}$ switches back to a state HOLD.

The solution described in relation with FIGS. 4 and 5 has different disadvantages, due to the dimensions of the selection transistors associated with each memory cell. Indeed, the selection transistors might not be able to withstand too high a current, such as for example the current which crosses the memory cell when it is in a low-impedance state.

Figure 6:
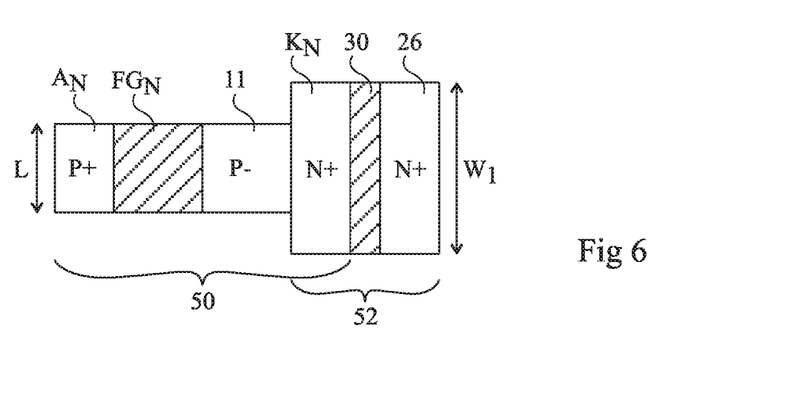
FIG. 6 is a top view of an embodiment of an N-type memory cell of $Z^2$-FET type along with its selection transistor.

FIG. 6 is a top view of an embodiment of an N-type $Z^2$-FET memory cell 50 along with its selection transistor 52, according to an embodiment of the present application. Selection transistor 52 is an N-channel MOS transistor (NMOS).

Memory cell 50 comprises the same elements as memory cell 20 described in relation with FIGS. 3A and 3B, that is, an anode region $A_N$, a cathode region $K_N$, an intermediate region 11, an insulating layer 15 (not shown in FIG. 6), and a front gate $FG_N$. Similarly, selection transistor 52 comprises the same elements as the selection transistor 22 described in relation with FIGS. 3A and 3B, that is, a drain region $K_N$, a channel region 24 (not shown in FIG. 6), a source region 26, a gate insulator layer 28 (not shown in FIG. 6), and a gate 30.

The difference between the components of FIGS. 3A and 3B and those of FIG. 6 is that, in FIG. 6, selection transistor 52 has a larger gate width $W_1$ than width L of the assembly formed by anode region $A_N$, the insulated gate, comprising front gate $FG_N$ and insulating layer 15, and intermediate layer 11. Cathode and drain region 9 of selection transistor 52 then has a width equal to $W_1$.

Figure 7:
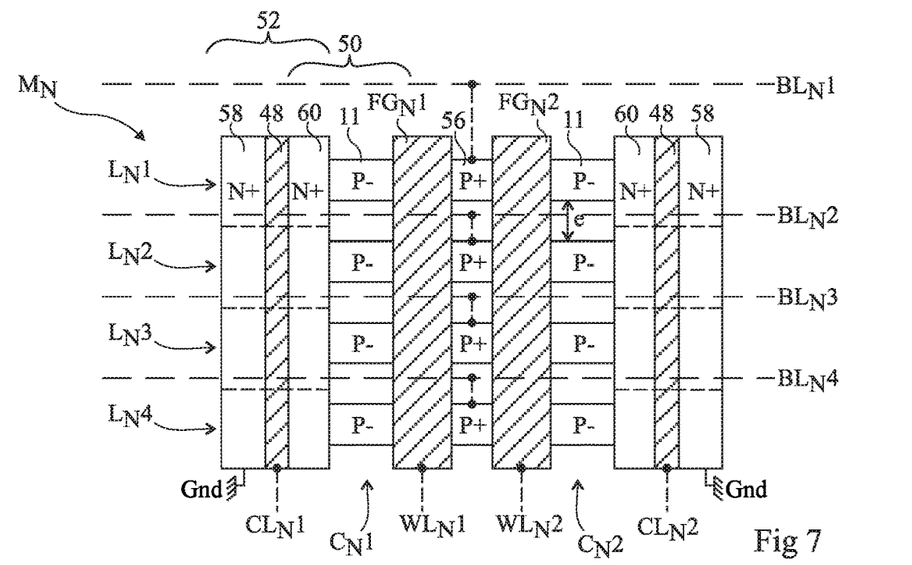
FIG. 7 is a top view of an embodiment of a memory array.

FIG. 7 is a top view of an embodiment of a sub-array $M_N$ of a memory array comprising N-type $Z^2$-FET memory cells. The memory array comprises a plurality of rows and columns of memory cells. The memory array may be divided into sub-arrays $M_N$ comprising a pair of memory cell columns. Sub-array $M_N$ comprises four rows $L_N1$, $L_N2$, $L_N3$, $L_N4$ and two columns $C_N1$, $C_N2$ of memory cells 50 along with their transistors 52 described in relation with FIG. 6.

Each row $L_N1$, $L_N2$, $L_N3$, $L_N4$ comprises two memory cells 50 sharing a common anode region 56, each along with its selection transistor 52. Common anode region 56 is heavily P-type doped (P+). Each anode region 56 of row $L_N1$, $L_N2$, $L_N3$, $L_N4$ is connected to a corresponding bit line $BL_N1$, $BL_N2$, $BL_N3$, $BL_N4$. Each memory cell 50 is accompanied by its selection transistor 52 as described in relation with FIG. 6. The intermediate region 11 of a memory cell 50 is spaced apart by a distance e from intermediate region 11 of memory cell 50 of the next row. Similarly, common anode region 56 is spaced apart by distance e from common anode region 56 of the next row. Distance e is equal to the difference between gate width W1 of selection transistor 52 and width L of memory cell 50. The common anode regions 56 of a same row of a memory array are all interconnected to the dedicated bit line.

Each column $C_N1$, $C_N2$ comprises four memory cells 50 along with their selection transistors 52. The four memory cells 50 of each column $C_N1$, $C_N2$ have a common front gate $FG_N1$, $FG_N2$ connected to a corresponding word line $WL_N1$, $WL_N2$. Gate width $W_1$ of selection transistors 52 is sufficiently large for the selection transistors 52 of a same column to be formed on a same active area of layer 1 and so that:

gates 30 of transistors 52 are formed on a common gate region 48;

the source regions 26 of transistors 52 are formed on a common heavily N-type doped region 58; and the drain regions $K_N$ of transistors 52 are formed on a common heavily N-type doped region 60.

Each common gate region 48 of the selection transistors 52 of columns $C_N1$, $C_N2$ is connected to a corresponding control line $CL_N1$, $CL_N2$. Source regions 58 of selection transistors 52 are all connected to a reference voltage, for example, the ground.

The operating mode of memory array $M_N$ is the same as that of array M of FIG. 4. This operating mode has been described hereabove in relation with FIG. 5.

Figure 8A:
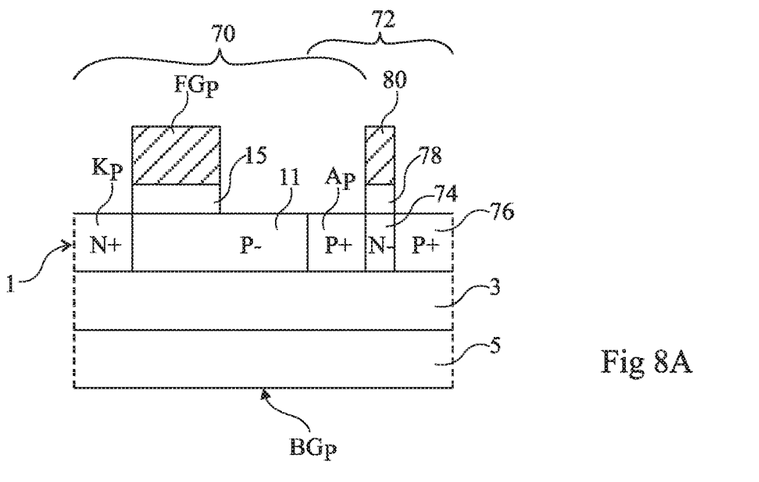
FIGS. 8A and 8B are a cross-section view and a top view of an embodiment of a P-type memory cell of $Z^2$-FET type along with its selection transistor.
Figure 8B:
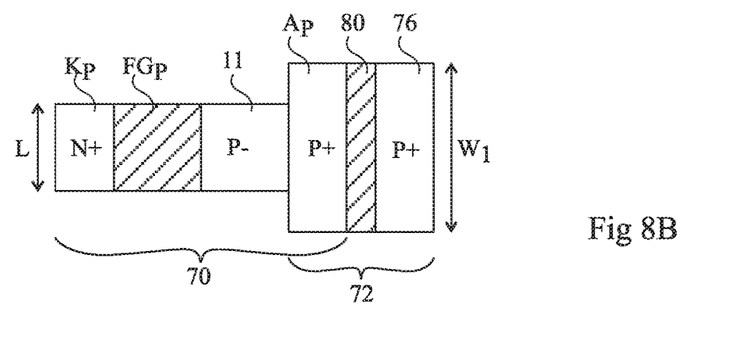

FIGS. 8A and 8B are a cross-section view and a top view of an embodiment of a P-type $Z^2$-FET memory cell 70 and of its selection transistor 72, in this case, selection transistor 72 is a P-channel MOS transistor (PMOS). Memory cell 70 is of the type of memory cell $PM_P$ of FIG. 2.

Conventionally, transistor 72 comprises a heavily-doped P-type drain region (P+), a lightly-doped N-type channel region 74 (N−), a heavily-doped P-type region 76 (P+), a gate insulator layer 78, and a conductive gate layer 80. Selection transistor 72 is formed on the same SOI structure (layers 1, 3, and 5) and in the same active area as memory cell 70. The drain region, channel region 74, and source region 76 are formed in semiconductor layer 1.

The drain region is heavily P-type doped (P+) and is formed by anode region $A_P$ of memory cell 70. Anode region $A_P$ will then be indifferently called anode region $A_P$, drain region $A_P$, or anode and drain region $A_P$. Channel region 74 is lightly N-type doped (N−) and is formed in a region adjacent to drain region $A_P$. Source region 76 is heavily P-type doped (P+) and is formed in a region adjacent to channel region 74. Gate insulator layer 78 rests on the upper surface of channel region 74. Gate layer or gate 80 rests on the upper surface of gate insulator layer 78. Conventionally, gate layer 80 may be made of polysilicon or of a conductive material, for example, a metal.

As in the embodiment described in relation with FIG. 6, selection transistor 72 has a gate width $W_1$ greater than width L of memory cell 70. Anode and drain region $A_P$ has, in this case, a width equal to $W_1$ so that the selection transistor has, in top view, a rectangular shape and that memory cell 70 is, in top view, T-shaped.

Figure 9:
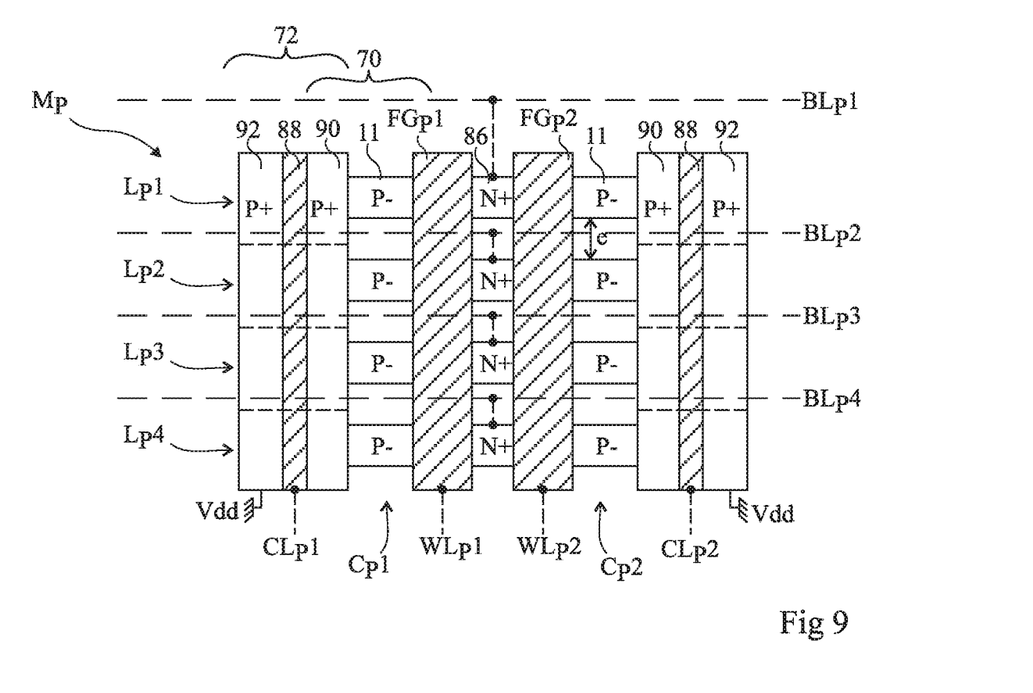
FIG. 9 is a top view of an embodiment of a memory array.

FIG. 9 is a top view of an embodiment of a sub-array $M_P$ of a memory array with P-type $Z^2$-FET memory cells. The memory array comprises a plurality of memory cell rows and columns. The memory array may be divided into sub-arrays $M_P$ comprising a pair of memory cell columns. Sub-array $M_P$ comprises four rows $L_P1$, $L_P2$, $L_P3$, $L_P4$ and two columns $C_N1$, $C_N2$ of memory cells 70 along with their transistor 72 described in relation with FIGS. 8A and 8B.

In other words, in each row $L_P1$, $L_P2$, $L_P3$, $L_P4$, the two memory cells 70 are positioned head-to-tail and have a common cathode region 86 connected to the corresponding bit line $BL_P1$, $BL_P2$, $BL_P3$, $BL_P4$. Rows $L_P1$, $L_P2$, $L_P3$, $L_P4$ are always spaced apart from one another by distance e defined in relation with FIG. 7.

In each column $C_r1$, $C_P2$, gate width $W_1$ of selection transistors 72 is sufficiently large for the selection transistors 72 of a same column to be formed on a same active area of layer 1 and so that:

the gate regions 80 of transistors 72 are formed on a common gate region 88;

the drain regions $A_P$ of transistors 72 are formed on a common heavily N-type doped region 90; and the source regions 76 of transistors 72 are formed on a common heavily N-type doped region 92.

Each gate region 88 of the selection transistors 72 of each column $C_r1$, $C_P2$ is connected to a corresponding control line $CL_N1$, $CL_N2$. The source regions 92 of selection transistors 72 are all connected to a high reference voltage, called Vdd.

Front gate regions $FG_P$ of the memory cells 70 of a same column are formed by a common front gate region $FG_P1$, $FG_P2$. Each gate region $FG_P1$, $FG_P2$ is connected to a word line $WL_P1$, $WL_P2$.

Figure 10:
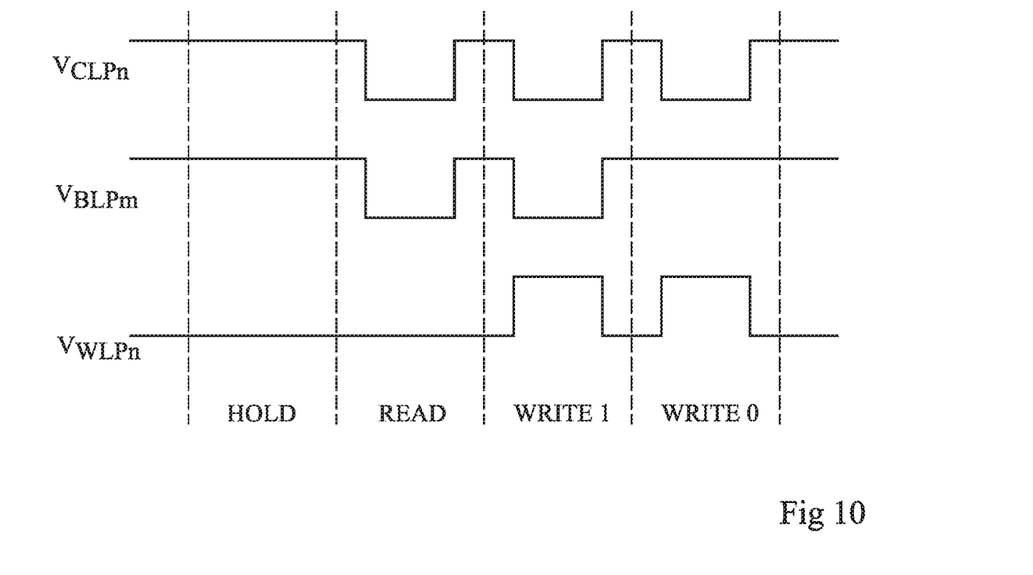
FIG. 10 is a timing diagram illustrating an embodiment of the memory array of FIG. 8.

FIG. 10 is a timing diagram illustrating an operating mode of a memory cell $70_{nm}$ of memory array $M_P$ of FIG. 9, belonging to a row $L_{pn}$ and to a column $C_{Pm}$. The timing diagram illustrates the time variation of voltages $V_{CLPn}$, $V_{BLPm}$, and $V_{WLPn}$ during different operations. Voltage $V_{CLPn}$ is the voltage of control line $CL_{Pn}$ associated with row $L_{Pn}$. Voltage $V_{BLPm}$ is the voltage of bit line $BL_{Pn}$ associated with column $C_P m$. Voltage $V_{WLPn}$ is the voltage of word line $WL_{Pn}$ associated with row $L_{Pn}$.

When memory cell $70_{nm}$ is waiting for a read or write operation, it is in a state HOLD. Voltages $V_{CLPn}$ and $V_{BLPm}$ are in a high state. Voltage $V_{WLPn}$ is in a low state.

During a read operation READ on memory cell $70_{nm}$, a low state is applied to voltages $V_{CLPn}$ and $V_{BLPm}$ during the entire read operation. Voltage $V_{WLPn}$ remains in a low state. Once the read operation is over, memory cell $70_{nm}$ switches back to a state HOLD.

During an operation of writing a "1" WRITE1 into memory cell $70_{nm}$, a low state is applied to voltages $V_{CLPn}$ and $V_{BLPm}$. A high state is applied to voltage $V_{WLPn}$ during the entire write operation. Once the write operation is over, memory cell $70_{nm}$ switches back to a state HOLD.

During an operation of writing a "0" WRITE0 into memory cell $70_{nm}$, a low state is applied to voltage $V_{CLPn}$. Voltage $V_{LBPm}$ remains in a high state. A high state is applied to voltage $V_{WLPn}$. Once the write operation is over, memory cell $70_{nm}$ switches back to a state HOLD. An advantage of the embodiments of FIGS. 6 to 10 is that the selection transistors are larger and have a larger gate width $W_1$. Thus, the selection transistors more easily withstand high currents, for example, in the range from 300 µA to 1 mA during a phase of writing a "1".

Another advantage of the embodiments of FIGS. 6 to 10 is that a selection transistor having a larger gate width has been integrated without increasing the size of the chip having the memory array formed thereon.

Specific embodiments have been described. Various alterations, modifications, and improvements will occur to those skilled in the art. In particular, other types of $Z^2$-FET memory cells may be considered, such as for example that described in U.S. Pat. No. 9,905,565 (incorporated by reference).

Various embodiments with various variations have been described here above. It should be noted that those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A memory array, comprising:
   a plurality of memory cells of $Z^2$-FET type; and
   a corresponding plurality of MOS-type selection transistors;
   wherein each memory cell comprises a first region of a first conductivity type in common with a drain region of the first conductivity type of a corresponding one of the MOS-type selection transistors; and
   wherein the MOS-type selection transistors of a same column of the memory array have a common drain region, a common source region, and a common channel region.

2. The memory array of claim 1, wherein the memory cells of a same column of the memory array have a common front gate.

3. The memory array of claim 2, wherein the common front gate of the memory cells of the same column is connected to a word line.

4. The memory array of claim 1, wherein each memory cell comprises a second region of a second conductivity type.

5. The memory array of claim 4, wherein the second regions of the memory cells of a same row of the memory array are connected to a bit line.

6. The memory array of claim 5, wherein the memory cells of the same row of the memory array are connected two by two and have a second common region.

7. The memory array of claim 1, wherein the common source region is connected to a reference voltage.

8. The memory array of claim 1, wherein the MOS-type selection transistors of a same column have a common gate.

9. The memory array of claim 8, wherein the common gate region of the MOS-type selection transistors of a same column of the memory array is connected to a control line.

10. The memory array of claim 1, wherein the MOS-type selection transistors are N-channel MOS transistors.

11. The memory array of claim 1, wherein the MOS-type selection transistors are P-channel MOS transistors.

12. The memory array of claim 1, wherein each memory cell of $Z^2$-FET type comprises, on a substrate:
   an anode region;
   a cathode region;
   a lightly-doped region separating the anode region from the cathode region; and
   an insulated gate region positioned on top of and in contact with a portion of the lightly-doped region.

13. The memory array of claim 12, wherein the cathode region is the first region and wherein a width of the anode region and lightly-doped region is smaller than a width of the first region, said widths being perpendicular to a direction extending between the drain region and source region of the MOS-type selection transistor.

14. The memory array of claim 12, wherein the anode region is the first region and wherein a width of the cathode region and lightly-doped region is smaller than a width of the first region, said widths being perpendicular to a direction extending between the drain region and source region of the MOS-type selection transistor.

15. A memory cell, comprising:
a $Z^2$-FET type memory device including an anode region, a cathode region and a lightly-doped region separating the anode region from the cathode region; and
a MOS-type selection transistor connected to the $Z^2$-FET type memory device;
wherein the cathode region of the $Z^2$-FET type memory device is also a drain region of the MOS-type selection transistor; and
wherein a width of the anode region and the lightly-doped region is smaller than a width of the cathode region, said widths being perpendicular to a direction extending between the drain region and a source region of the MOS-type selection transistor.

16. The memory cell of claim 15, wherein a front gate of the $Z^2$-FET type memory device is connected to a word line.

17. The memory cell of claim 15, wherein the anode region of the $Z^2$-FET type memory device is connected to a bit line.

18. The memory cell of claim 15, wherein the source region is connected to a reference voltage.

19. A memory cell, comprising:
a $Z^2$-FET type memory device including an anode region, a cathode region and a lightly-doped region separating the anode region from the cathode region; and
a MOS-type selection transistor connected to the $Z^2$-FET type memory device;
wherein the anode region of the $Z^2$-FET type memory device is also a drain region of the MOS-type selection transistor; and
wherein a width of the cathode region and lightly-doped region is smaller than a width of the anode region, said widths being perpendicular to a direction extending between the drain region and source region of the MOS-type selection transistor.

20. The memory cell of claim 19, wherein a front gate of the $Z^2$-FET type memory device is connected to a word line.

21. The memory cell of claim 19, wherein the anode region of the $Z^2$-FET type memory device is connected to a bit line.

22. The memory cell of claim 19, wherein the source region is connected to a reference voltage.

23. A method of manufacturing a memory array, comprising:
forming a plurality of memory cells of $Z^2$-FET type and a plurality of MOS-type selection transistors arranged in rows and in columns, comprising:
forming each memory cell to include a first region of a first conductivity type;
forming each MOS-type selection transistor to include a drain region in common with the first region of the memory cell and with all selection transistors of a same column;
forming a source region common to all the MOS-type selection transistors of the same column; and
forming a gate region common to all the MOS-type selection transistors of the same column.

* * * * *